(12) United States Patent
Jang et al.

(10) Patent No.: US 7,863,957 B2
(45) Date of Patent: Jan. 4, 2011

(54) DUTY CYCLE CORRECTION CIRCUIT AND SEMICONDUCTOR INTEGRATED CIRCUIT APPARATUS INCLUDING THE SAME

(75) Inventors: Jae-Min Jang, Ichon (KR); Yong-Ju Kim, Ichon (KR); Sung-Woo Han, Ichon (KR); Hee-Woong Song, Ichon (KR); Ic-Su Oh, Ichon (KR); Hyung-Soo Kim, Ichon (KR); Tae-Jin Hwang, Ichon (KR); Hae-Rang Choi, Ichon (KR); Ji-Wang Lee, Ichon (KR); Chang-Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 71 days.

(21) Appl. No.: 12/331,294

(22) Filed: Dec. 9, 2008

(65) Prior Publication Data

US 2009/0231006 A1 Sep. 17, 2009

(30) Foreign Application Priority Data

Mar. 14, 2008 (KR) ...................... 10-2008-0023978

(51) Int. Cl.
*H03K 5/04* (2006.01)
(52) U.S. Cl. ........................ 327/175; 327/158; 327/291; 327/299
(58) Field of Classification Search ......... 327/158–159, 327/161, 170, 172–176, 291–294, 298–299
See application file for complete search history.

(56) References Cited

U.S. PATENT DOCUMENTS

| 5,151,614 | A | * | 9/1992 | Yamazaki et al. | ........... | 327/143 |
|---|---|---|---|---|---|---|
| 6,853,225 | B2 | | 2/2005 | Lee | | |
| 6,859,081 | B2 | | 2/2005 | Hong et al. | | |
| 7,184,509 | B2 | | 2/2007 | Cho et al. | | |
| 7,279,946 | B2 | * | 10/2007 | Minzoni | ...................... | 327/158 |
| 7,388,408 | B2 | * | 6/2008 | Liu et al. | ...................... | 327/12 |
| 7,633,324 | B2 | * | 12/2009 | Yun et al. | ................... | 327/160 |
| 7,639,552 | B2 | * | 12/2009 | Ku | .............. | 365/194 |
| 2008/0164920 | A1 | * | 7/2008 | Cho | .......................... | 327/158 |
| 2009/0115475 | A1 | * | 5/2009 | Oh | ............................ | 327/158 |
| 2009/0278580 | A1 | * | 11/2009 | Kim | ........................... | 327/158 |

FOREIGN PATENT DOCUMENTS

| JP | 2007-121114 | 5/2007 |
|---|---|---|
| JP | 2007-311009 | 11/2007 |
| KR | 100808594 B1 | 2/2008 |

* cited by examiner

*Primary Examiner*—An T Luu
(74) *Attorney, Agent, or Firm*—Baker & McKenzie LLP

(57) ABSTRACT

A duty cycle correction circuit includes a phase splitter configured to control a phase of a DLL clock signal to generate a rising clock signal and a falling clock signal, a clock delay unit configured to delay the rising clock signal and the falling clock signal in response to control signals to generate a delayed rising clock signal and a delayed falling clock signal, a duty ratio correction unit configured to generate a correction rising clock signal and a correction falling clock signal that toggle in response to an edge timing of the delayed rising clock signal and the delayed falling clock signal, and a delay control unit configured to detect duty cycles of the correction rising clock signal and the correction falling clock signal to generate the control signals.

25 Claims, 5 Drawing Sheets

DUTY CYCLE CORRECTION CIRCUIT AND SEMICONDUCTOR INTEGRATED CIRCUIT APPARATUS INCLUDING THE SAME

CROSS-REFERENCES TO RELATED APPLICATION

The present application claims priority under 35 U.S.C. §119(a) to Korean application number 10-2008-0023978, filed on Mar. 14, 2008, in the Korean Intellectual Property Office, which is incorporated by reference in its entirety as set forth in full.

BACKGROUND

1. Technical Field

The embodiments described herein relate to a semiconductor integrated circuit, and more particularly, to a duty cycle correction circuit and a semiconductor integrated circuit apparatus including the same.

2. Related Art

In general, a semiconductor integrated circuit such as Double Data Rate Synchronous Dynamic Random Access Memory (DDR SDRAM) improves its operational speed by using both rising and falling edges of clock signals when processing data. Accordingly, unless a ratio of a rising edge interval to a falling edge interval of a clock signal, i.e., a duty ratio, is 50:50, operational efficiency of the integrated circuit is degraded. However, it is difficult for a clock signal used in a semiconductor integrated circuit to have an accurate duty ratio due to various influences, such as a noise, which may exist in the semiconductor integrated circuit. Thus, in order to improve operational efficiency, a semiconductor integrated circuit includes a duty cycle correction circuit to correct a duty ratio of a clock signal.

Commonly, a duty cycle correction circuit is included in a Delay Locked Loop (DLL) circuit to correct a duty cycle of a clock signal pair output from the DLL circuit. However, although it performs a duty cycle correction operation on clock signals at output terminals of the DLL circuit, it causes distorted a duty ratios of clock signals due to delay elements that exist in downstream transmission lines. In addition, when a clock signal pair is transmitted, the transmission line had to be realized as a transmission line pair. Accordingly, area efficiency and power efficiency of a semiconductor integrated circuit are degraded. As a result, the use of a general duty cycle correction circuit in the DLL circuit caused problems, such as signal distortion by a transmission line, area efficiency degradation, and power efficiency degradation.

SUMMARY

A duty cycle correction circuit and semiconductor integrated circuit apparatus capable of providing improved duty ratio characteristics, high integration, and low power consumption are described herein.

In one aspect, a duty cycle correction circuit includes a phase splitter configured to control a phase of a DLL clock signal to generate a rising clock signal and a falling clock signal, a clock delay unit configured to delay the rising clock signal and the falling clock signal in response to control signals to generate a delayed rising clock signal and a delayed falling clock signal, a duty ratio correction unit configured to generate a correction rising clock signal and a correction falling clock signal that toggle in response to an edge timing of the delayed rising clock signal and the delayed falling clock signal, and a delay control unit configured to detect duty cycles of the correction rising clock signal and the correction falling clock signal to generate the control signals.

In another aspect, a semiconductor integrated circuit apparatus includes a Delay Locked Loop circuit block configured to generate a DLL clock signal having a phase faster than a phase of an external clock signal by a predetermined time, a transmission line configured to transmit the DLL clock signal, a duty cycle correction circuit block configured to correct a duty cycle of the DLL clock signal transmitted through the transmission line to generate a correction rising clock signal and a correction falling clock signal, and a data output circuit block configured to perform a data output operation by using the correction rising clock signal and the correction falling clock signal.

These and other features, aspects, and embodiments are described below in the section "Detailed Description."

BRIEF DESCRIPTION OF THE DRAWINGS

Features, aspects, and embodiments are described in conjunction with the accompanying drawings, in which.

DETAILED DESCRIPTION

Figure 1:
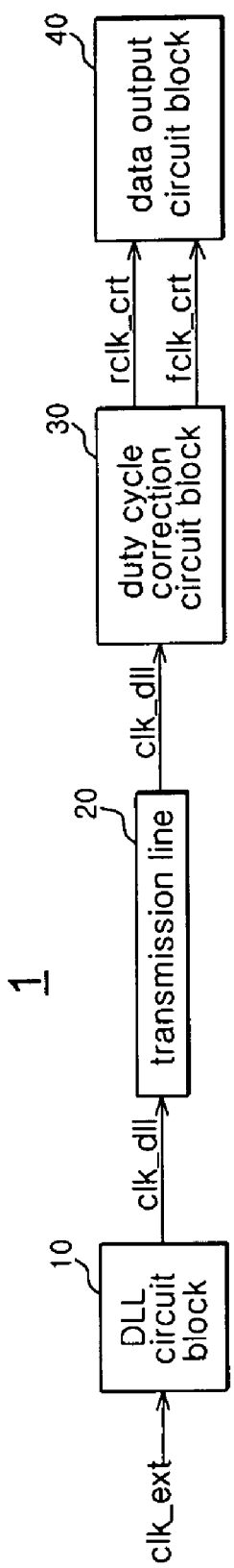
FIG. 1 is a schematic block diagram of an exemplary semiconductor integrated circuit apparatus according to one embodiment.

FIG. 1 is a schematic block diagram of an exemplary semiconductor integrated circuit apparatus according to one embodiment. In FIG. 1, a semiconductor integrated circuit apparatus 1 can include a DLL circuit block 10, a transmission line 20, a duty cycle correction circuit block 30, and a data output circuit block 40.

The DLL circuit block 10 can be configured to generate a DLL clock signal 'clk_dll' having a phase faster than a phase of an external clock signal 'clk_ext' by a predetermined time. Here, the DLL clock signal 'clk_dll' can have a single signal configuration instead of a clock signal pair.

The transmission line 20 can be configured to transmit the DLL clock signal 'clk_dll' to the duty cycle correction circuit block 30 to correct the duty cycle of the DLL clock signal 'clk_dll' and then generate a correction rising clock signal 'rclk_crt' and a correction falling clock signal 'fclk_crt'. The duty cycle correction circuit block 30 can be configured to control a phase of the DLL clock signal 'clk_dll' to generate rising and falling clock signals, and then, by using them, can perform a duty cycle correction operation to generate the correction rising clock signal 'rclk_crt' and the correction falling clock signal 'fclk_crt'.

The data output circuit block 40 can perform a data output operation by using the correction rising clock signal 'rclk_crt' and the correction falling clock signal 'fclk_crt'. Accordingly, although a duty cycle of the DLL clock signal 'clk_dll' can be distorted due to delay elements that exist in the transmission line 20, since the duty cycle correction circuit block 30 can correct the DLL clock signal 'clk_dll' afterwards, a clock pair having more improved duty ratio characteristics can be transferred to the data output circuit block 40.

In addition, since the transmission line 20 can transmit not a clock signal pair but a single clock signal, an occupation area thereof can be reduced. Accordingly, the area efficiency of the semiconductor integrated circuit can be improved. Moreover, since a current consumed in the transmission line 20 can be reduced, the power efficiency of the semiconductor integrated circuit can be improved.

Figure 2:
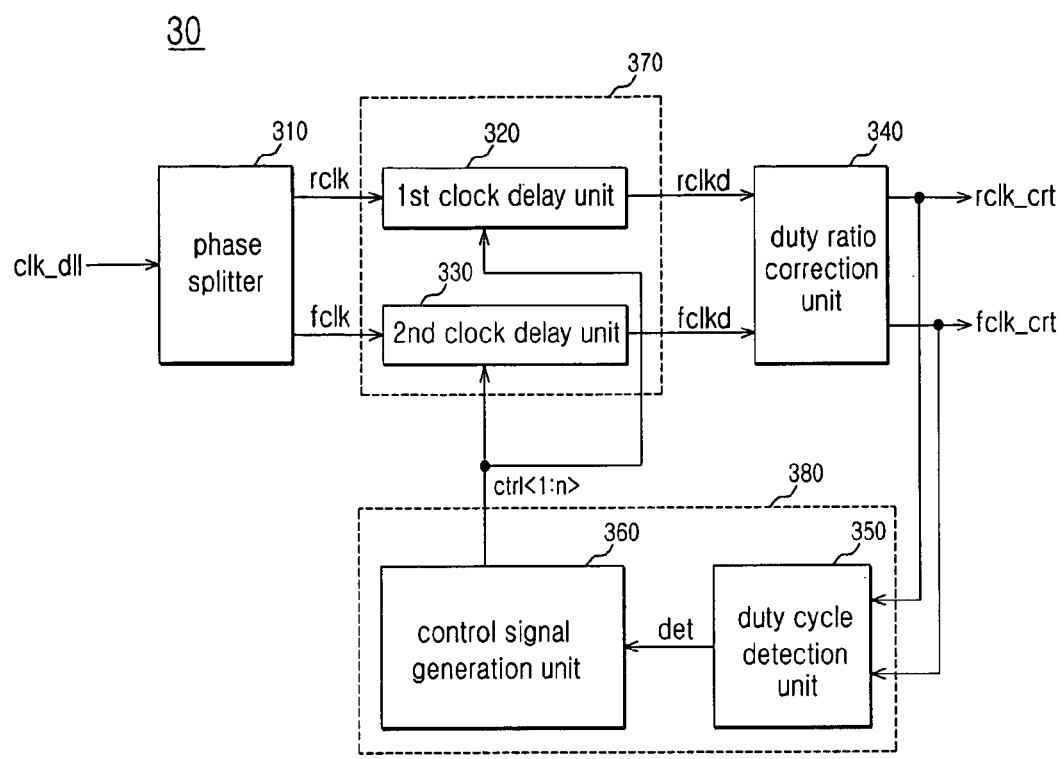
FIG. 2 is a schematic block diagram of an exemplary duty cycle correction circuit block capable of being implemented in the apparatus of FIG. 1 according to one embodiment.

FIG. 2 is a schematic block diagram of an exemplary duty cycle correction circuit block capable of being implemented in the apparatus of FIG. 1 according to one embodiment. In FIG. 2, the duty cycle correction circuit block 30 can include a phase splitter 310, a clock delay unit 370 for having first and second clock delay units 320 and 330, a duty ratio correction unit 340, and a delay control unit 380 for having a control signal generation unit 360 and a duty cycle detection unit 350.

The phase splitter 310 can control (invert) a phase of the DLL clock signal 'clk_dll' to generate the falling clock signal 'fclk', and can output the DLL clock signal 'clk_dll' as the rising clock signal 'rclk'. For example, the phase splitter 310 can be configured of inverters.

The clock delay unit 370 can delay the rising clock signal 'rclk' and the falling clock signal 'fclk' in response to an n-number of bit control signals 'ctrl<1:n>' to generate the delayed rising clock signal 'rclkd' and the delayed falling clock signal 'fclkd', respectively. For example, the first clock delay unit 320 can delay the rising clock signal 'rclk' in response to the n-number of bit control signals 'ctrl<1:n>' to generate the delayed rising clock signal 'rclkd'. Similarly, the second clock delay unit 330 can delay the falling clock 'fclk' in response to the n-number of bit control signals 'ctrl<1:n>' to generate the delayed falling clock signal 'fclkd'.

The first clock delay unit 320 and the second clock delay unit 330 can delay the rising clock 'rclk' and the falling clock 'fclk', respectively, with variation according to logical values of the n-number of bit control signals 'ctrl<1:n>'. In addition, the delayed rising clock signal 'rclkd' and the delayed falling clock signal 'fclkd' generated can have a phase difference as much as one-half of a period.

The duty ratio correction unit 340 can be configured to generate the correction rising clock signal 'rclk_crt' and the correction falling clock signal 'fclk_crt' that can toggle according to edge timings of the delayed rising clock signal 'rclkd' and the delayed falling clock signal 'fclkd'. For example, the duty ratio correction unit 340 can be configured to generate two clock signals that toggle to phases opposite to each other at every rising edge time of the delayed rising clock signal 'rclkd' and the delayed falling clock signal 'fclkd', and can output them as the correction rising clock signal 'rclk_crt' and the correction falling clock signal 'fclk_crt', respectively.

As duty cycle correction operations of the duty cycle correction circuit block 30 on the DLL clock signal 'clk_dll' are being performed, the delayed rising clock signal 'rclkd' and the delayed falling clock signal 'fclkd' can increase to have a phase difference as much as one-half of a period, and then the correction rising clock signal 'rclk_crt' and the correction falling clock signal 'fclk_crt' can increase to have phases opposite to each other.

The duty cycle detection unit 350 can be configured to detect duty cycles of the correction rising clock signal 'rclk_crt' and the correction falling clock signal 'fclk_crt', and can generate a detection signal 'det'. For example, the duty cycle detection unit 350 can be realized by use of a duty accumulator. More specifically, the duty cycle detection unit 350 can detect interval lengths of a high interval and a low interval of the correction rising clock signal 'rclk_crt' and the correction falling clock signal 'fclk_crt', and can output detected information by use of the detection signal 'det'.

The control signal generation unit 360 can be configured to generate the control signals 'ctrl<1:n>', which can be composed of digital signals having an n-number of bits, in response to the detection signal 'det'. For example, the n-number of bit control signals 'ctrl<1:n>' can be realized such that the number of signals having a logical value—1— can increase or decrease according to a level of the detection signal 'det'.

The duty cycle correction circuit block 30 can be configured to receive the DLL clock signal 'clk_dll', which is not a clock signal pair but a single clock signal, and can generate a clock signal pair by performing phase inverting operations. In addition, with use of a self-equipped feedback loop, the duty cycle correction circuit block 30 can be configured to detect duty cycles of output clock signals, i.e., the correction rising clock signal 'rclk_crt' and the correction falling clock signal 'fclk_crt', and can then generate the delayed rising clock signal 'rclkd' and the delayed falling clock signal 'fclkd' having a phase difference as much as one-half of a period. Since the correction rising clock signal 'rclk_crt' and the correction falling clock signal 'fclk_crt' can be realized to toggle at every rising edge time of the delayed rising clock signal 'rclkd' and the delayed falling clock signal 'fclkd', the correction rising clock signal 'rclk_crt' and the correction falling clock signal 'fclk_crt' can have a duty ratio of about 50:50.

Figure 3:
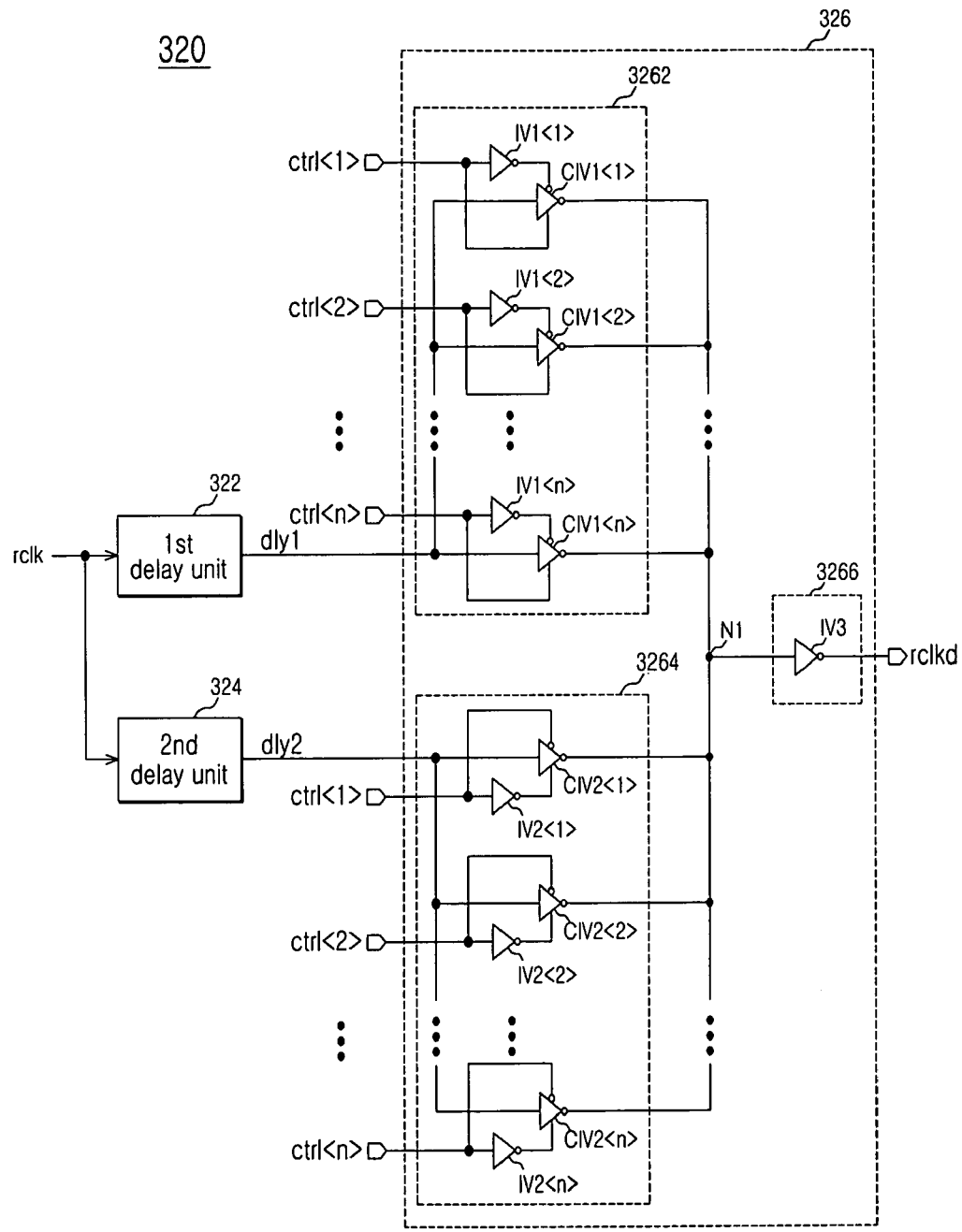
FIG. 3 is a schematic circuit diagram of an exemplary first clock delay unit capable of being implemented in the block of FIG. 2 according to one embodiment.

FIG. 3 is a schematic circuit diagram of an exemplary first clock delay unit capable of being implemented in the block of FIG. 2 according to one embodiment. In FIG. 3, the first clock delay unit 320 can include a first delay unit 322, a second delay unit 324, and a phase mixing unit 326.

The first delay unit 322 can delay the rising clock signal 'rclk' by as much as a first time to generate a first delay signal 'dly1'. Similarly, the second delay unit 324 can delay the rising clock signal 'rclk' by as much as a second time to generate a second delay signal 'dly2'. Here, an interval length of the first time which the first delay unit 322 has as a delay time can be different from a length of the second time which the second delay unit 324 has as a delay time. For example, the second time can be longer than the first time. Both the first delay unit 322 and the second delay unit 324 can be realized by combining a plurality of delay elements.

The phase mixing unit 326 can be configured to mix a phase of the first delay signal 'dly1' and a phase of the second delay signal 'dly2' in response to the n-number of bit control signals 'ctrl<1:n>' to generate the delayed rising clock signal 'rclkd'. For example, the phase mixing unit 326 can include a first node (N1), a first driving unit 3262, a second driving unit 3264, and a buffering unit 3266.

The first driving unit 3262 can be configured to drive the first delay signal 'dly1' in response to the n-number of bit control signals 'ctrl<1:n>' to transmit the first delay signal 'dly1' to the first node (N1). Similarly, the second driving unit 3264 can be configured to drive the second delay signal 'dly2' in response to the n-bit control signals 'ctrl<1:n>' to transmit the second delay signal 'dly2' to the first node (N1). In addition, the buffering unit 3266 can buffer signals transmitted to the node (N1) to generate the delayed rising clock signal 'rclkd'.

For example, the first driving unit 3262 can include an n-number of first inverters IV1<1:n> for receiving respective bits of the n-number of bit control signals 'ctrl<1:n>' as inputs, and an n-number of first control inverters CIV1<1:n> for respectively driving the first delay signal 'dly1' in response to respective bits of the n-number of bit control signals 'ctrl<1:n>' and corresponding output signals of an n-number of the first inverters IV1<1:n> to respectively output the first delay signal 'dly1' to the first node (N1).

In addition, the second driving unit 3264 can include an n-number of second inverters IV2<1:n> for receiving respective bits of the n-number of bit control signals 'ctrl<1:n>' as inputs, and an n-number of second control inverters CIV2<1:n> for respectively driving the second delay signal 'dly2' in response to respective bits of the n-number of bit control signals 'ctrl<1:n>' and corresponding output signals of an n-number of the second inverters IV2<1:n> to respectively output the second delay signal 'dly2' to the first node (N1).

Moreover, the buffering unit 3266 can include a third inverter IV3.

In FIG. 3, the number of control inverters enabled in the first driving unit 3262 and the number of control inverters enabled in the second driving unit 3264 can be determined according to electric potential levels that the respective n-number of bit control signals 'ctrl<1:n>' have. If the first driving unit 3262 has a substantially stronger driving power than the second driving unit 3264 according to the n-number of bit control signals 'ctrl<1:n>', then a phase of the delayed rising clock signal 'rclkd' can become closer to a phase of the first delay signal 'dly1' than a phase of the second delay signal 'dly2'. As a result, since the phase mixing unit 326 can control the number of control inverters enabled in the first driving unit 3262 and the second driving unit 3264 in response to the n-number of bit control signals 'ctrl<1:n>', it is possible to precisely control an output timing of the delayed rising clock signal 'rclkd'.

Similar to an operation of the first clock delay unit 320, the second clock delay unit 330 can discriminately delay the falling clock signal 'fclk'. It is possible to control an output timing of the delayed falling clock signal 'fclkd' by performing operations of mixing phases of signals delayed in response to the n-number of bit control signals 'ctrl<1:n>'. As a result, since the first clock delay unit 320 and the second clock delay unit 330 can perform operations of delaying the rising clock signal 'rclk' and the falling clock signal 'fclk', respectively, it is possible to generate the delayed rising clock signal 'rclkd' and the delayed falling clock signal 'fclkd' having a phase difference by as much as one-half of a period according to logical values that the n-number of bit control signals 'ctrl<1:n>' have.

Since the second clock delay unit 330 can have substantially the same structure as the first clock delay unit 320, a detailed explanation of the second clock delay unit 330 will be omitted for the sake of brevity.

Figure 4:
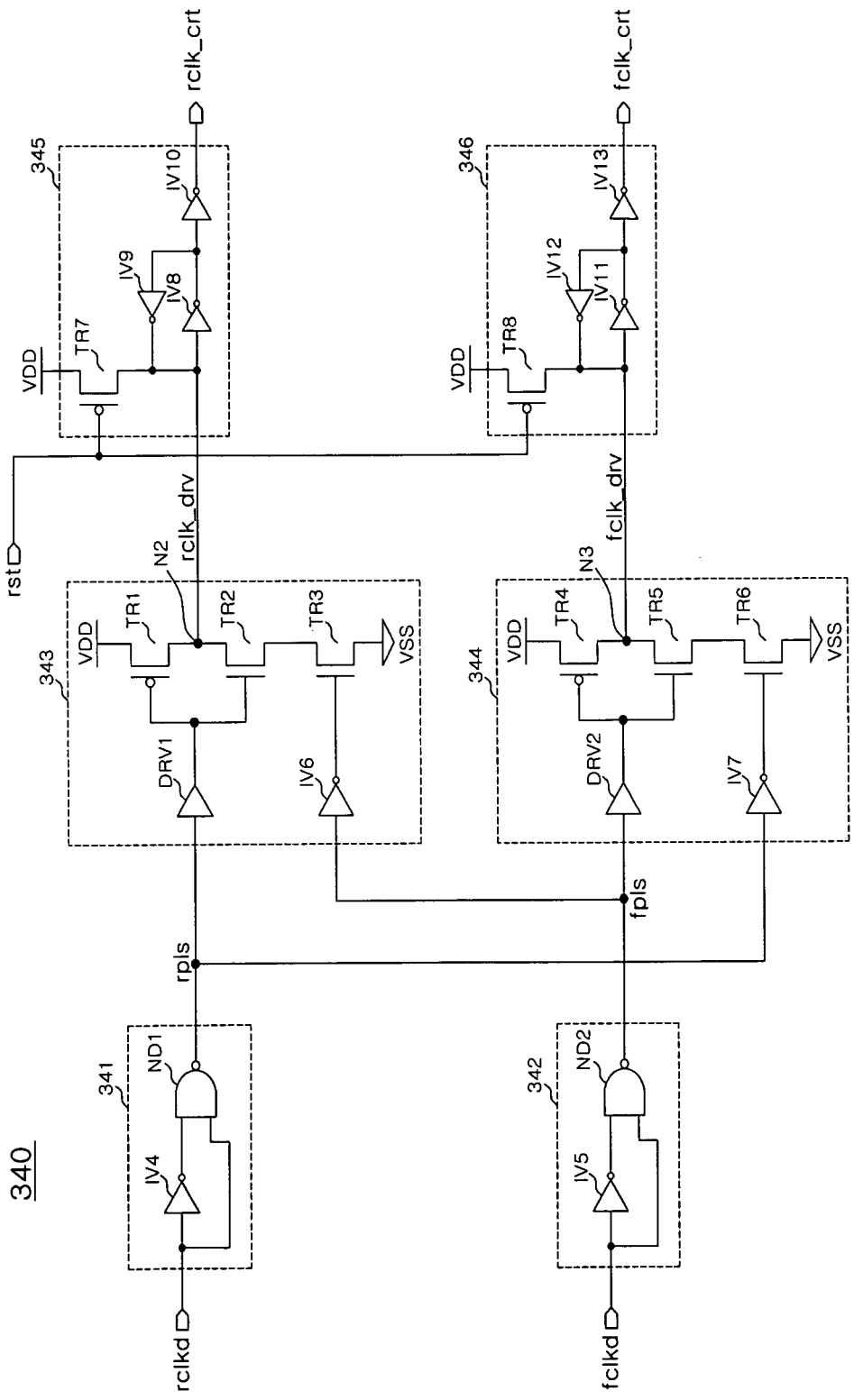
FIG. 4 is a schematic circuit diagram of an exemplary duty ratio correction unit capable of being implemented in the block of FIG. 2 according to one embodiment.

FIG. 4 is a schematic circuit diagram of an exemplary duty ratio correction unit capable of being implemented in the block of FIG. 2 according to one embodiment. In FIG. 4, the duty ratio correction unit 340 can include a second node (N2), a third node (N3), a rising pulse generation unit 341, a falling pulse generation unit 342, a rising clock generation unit 343, a falling clock generation unit 344, a rising latch unit 345, and a falling latch unit 346.

The rising pulse generation unit 341 can be configured to generate a rising pulse signal 'rpls' that can be produced in a pulse-type format at every rising edge of the delayed rising clock signal 'rclkd'. For example, the rising pulse generation unit 341 can include a fourth inverter IV4 for receiving the delayed rising clock signal 'rclkd' as input, and a first NAND gate ND1 for receiving the delayed rising clock signal 'rclkd' and an output signal of the fourth inverter IV4 as inputs to output the rising pulse signal 'rpls'.

The falling pulse generation unit 342 can be configured to generate a falling pulse signal 'fpls' that can be produced in a pulse-type format at every rising edge of the delayed falling clock signal 'fclkd'. For example, the falling pulse generation unit 342 can include a fifth inverter IV5 for receiving the delayed falling clock signal 'fclkd' as input, and a second NAND gate ND2 for receiving the delayed falling clock signal 'fclkd' and an output signal of the fifth inverter IV5 as inputs to output the falling pulse signal 'fpls'.

The rising clock generation unit 343 can be configured to generate a rising driving clock signal 'rclk_drv' that can toggle in response to the rising pulse signal 'rpls' and the falling pulse signal 'fpls' to output the rising driving clock signal 'rclk_drv' to the second node (N2). For example, the rising clock generation unit 343 can include a first driver DRV1 for driving the rising pulse signal 'rpls', and a sixth inverter IV6 for receiving the falling pulse signal 'fpls'. In addition, the rising clock generation unit 343 can include a first transistor TR1 having a gate terminal receiving an output signal of the first driver DRV1, a source terminal receiving an external supply voltage VDD, and a drain terminal connected to the second node (N2), a second transistor TR2 having a gate terminal receiving an output signal of the first driver DRV1, and a drain terminal connected to the second node (N2), and a third transistor TR3 having a gate terminal receiving an output signal of the sixth inverter IV6, a drain terminal connected to a source terminal of the second transistor TR2, and a source terminal connected to a ground voltage VSS.

In FIG. 4, the falling clock generation unit 344 can be configured to generate a falling driving clock signal 'fclk_drv' that can toggle in response to the rising pulse signal 'rpls' and the falling pulse signal 'fpls' to output the falling driving clock signal 'fclk_drv' to the third node (N3). For example, the falling clock generation unit 344 can include a second driver DRV2 for driving the falling pulse signal 'fpls', a seventh inverter IV7 for receiving the rising pulse signal 'rpls', a fourth transistor TR4 having a gate terminal receiving an output signal of the second driver DRV2, a source terminal receiving an external supply voltage VDD, and a drain terminal connected to the third node (N3). In addition, the falling clock generation unit 344 can include a fifth transistor TR5 having a gate terminal receiving an output signal of the second driver DRV2, and a drain terminal connected to the third node (N3), and a sixth transistor TR6 having a gate terminal receiving an output signal of the seventh inverter IV7, a drain terminal connected to a source terminal of the fifth transistor TR5, and a source terminal connected to a ground voltage VSS.

The rising latch unit 345 can be configured to latch the rising driving clock signal 'rclk_drv' in response to a reset signal 'rst' to generate the correction rising clock signal 'rclk_crt'. For example, the rising latch unit 345 can include a seventh transistor TR7 having a gate terminal receiving the reset signal 'rst', a source terminal receiving the external supply voltage VDD, and a drain terminal connected to the second node (N2), a eighth inverter IV8 for receiving the rising driving clock 'rclk_drv', and a ninth inverter IV9 for forming a latch structure with the eighth inverter IV8. In addition, the rising latch unit 345 can include a tenth inverter IV10 for receiving an output signal of the eighth inverter IV8 to generate the correction rising clock signal 'rclk_crt'.

The falling latch unit 346 can be configured to latch the falling driving clock signal 'fclk_drv' in response to the reset signal 'rst' to generate the correction falling clock signal 'fclk_crt'. For example, the falling latch unit 346 can include an eighth transistor TR8 having a gate terminal receiving the reset signal 'rst', a source terminal receiving the external supply voltage VDD, a drain terminal connected to the third node (N3), and a eleventh inverter IV11 for receiving the falling driving clock signal 'fclk_drv'. In addition, the falling latch unit 346 can include a twelfth inverter IV12 for forming a latch structure with the eleventh inverter IV11, and a thirteenth inverter IV13 for receiving an output signal of the eleventh inverter IV11 to generate the correction falling clock signal 'fclk_crt'.

Accordingly, the duty ratio correction unit 340 can be realized such that the rising pulse signal 'rpls' and the falling pulse signal 'fpls' can toggle to their logical low levels at every rising edge time of the delayed rising clock signal 'rclkd' and the delayed falling clock signal 'fclkd', respectively. Since the delayed rising clock signal 'rclkd' and the delayed falling clock signal 'fclkd' can be controlled to have a phase difference by as much as one-half of a period, the rising pulse signal 'rpls' and the falling pulse signal 'fpls' can be controlled to have a phase difference by as much as one-half of a period of the delayed rising clock signal 'rclkd' or the delayed falling clock signal 'fclkd'.

The rising driving clock signal 'rclk_drv' can be realized transition to a logical low level when the falling pulse signal 'fpls' toggles, and can transition to a logical high level when the rising pulse signal 'rpls' toggles. In a similar manner, the falling driving clock signal 'fclk_drv' can be realized to transition to a logical low level when the rising pulse signal 'rpls' toggles, and can transition to a logical high level when the falling pulse signal 'fpls' toggles.

In FIG. 4, the reset signal 'rst' should be realized as a logical low enable signal. Here, when the reset signal 'rst' is enabled and then disabled, afterwards, the rising latch unit 345 can latch and drive the rising driving clock signal 'rclk_drv' to generate the correction rising clock signal 'rclk_crt'. In addition, the falling latch unit 346 can latch and drive the falling driving clock signal 'fclk_drv' to generate the correction falling clock signal 'fclk_crt'. As these operations are performed repeatedly, the correction rising clock signal 'rclk_crt' and the correction falling clock signal 'fclk_crt' can gradually increase to become clock signals having a duty ratio of about 50:50.

Figure 5:
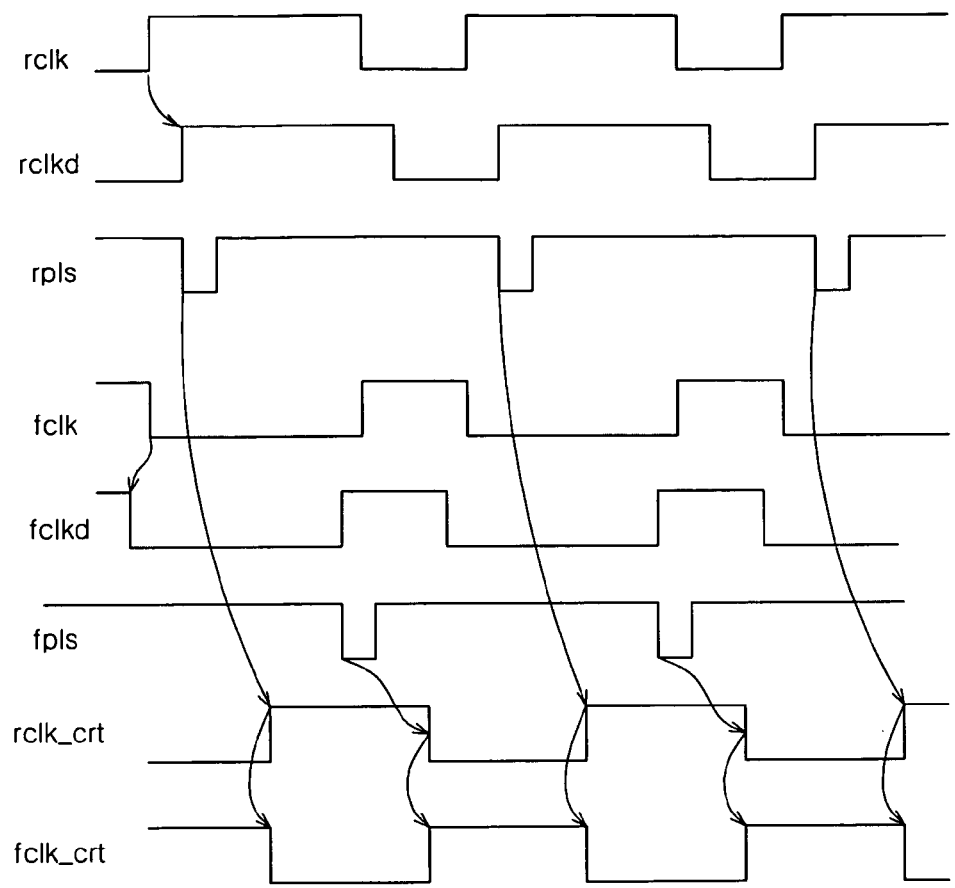
FIG. 5 is a timing diagram demonstrating exemplary operations of the block of FIG. 2 according to one embodiment.

FIG. 5 is a timing diagram demonstrating exemplary operations of the block of FIG. 2 according to one embodiment. In FIG. 5, the rising clock signal 'rclk' can have a high interval substantially wider than a low interval, and the falling clock signal 'fclk' can have a high interval substantially narrower than a low interval. For example, the delayed rising clock signal 'rclkd' and the delayed falling clock signal 'fclkd' can be generated by delaying the rising clock signal 'rclk' and the falling clock signal 'fclk', wherein the delayed falling clock signal 'fclkd' can be generated such that a minus (−) delay time is given to the falling clock signal 'fclk'. In addition, the delayed rising clock signal 'rclkd' and the delayed falling clock signal 'fclkd' can increase to have a phase difference by as much as one-half of a period of the rising clock signal 'rclk' or the falling clock signal 'fclk' according to control of the n-number of bit control signals 'ctrl<1:n>'.

The rising pulse signal 'rpls' and the falling pulse signal 'fpls' can be toggling at every rising edge time of the delayed rising clock signal 'rclkd' and the delayed falling clock signal 'fclkd' and, afterwards, the correction rising clock signal 'rclk_crt' and the correction falling clock signal 'fclk_crt' can be toggled as having phases opposite to each other at every toggle timing of the rising pulse signal 'rpls' and the falling pulse signal 'fpls'.

Accordingly, a duty cycle correction circuit and a semiconductor integrated circuit apparatus including the same can receive a single clock signal as input to invert the clock signal to an opposite phase and then perform duty cycle correction operations. Thus, the duty cycle correction circuit is not required to be implemented in a DLL circuit, but can be placed within a region using a clock signal, i.e., in a data output apparatus, thereby providing a clock signal having more improved duty ratio characteristics. Moreover, since the duty cycle correction circuit can reduce an occupation area of a transmission line transmitting a DLL clock signal output from a DLL circuit, high integration of a semiconductor integrated circuit can be realized, In addition, since the duty cycle correction circuit can reduce current consumption in a transmission line, it can realize low power consumption.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A duty cycle correction circuit, comprising:
  a phase splitter configured to control a phase of a DLL clock signal to generate a rising clock signal and a falling clock signal;
  a clock delay unit configured to delay the rising clock signal and the falling clock signal in response to control signals to generate a delayed rising clock signal and a delayed falling clock signal;
  a duty ratio correction unit configured to generate a correction rising clock signal and a correction falling clock signal that toggle in response to an edge timing of the delayed rising clock signal and the delayed falling clock signal; and
  a delay control unit configured to detect duty cycles of the correction rising clock signal and the correction falling clock signal to generate the control signals,
  wherein the control signals are digital signals having multiple bits, and the clock delay unit is configured to delay the rising clock signal and the falling clock signal with variation according to logical values of the control signals in order that the delayed rising clock signal and the delayed falling clock signal have a phase difference by as much as one-half of a period.

2. The duty cycle correction circuit of claim 1, wherein the DLL clock signal is configured to be output as a single clock signal.

3. The duty cycle correction circuit of claim 2, wherein the phase splitter is configured to generate the falling clock signal by inverting the phase of the DLL clock signal, and the rising clock and the falling clock have phases opposite to each other.

4. The duty cycle correction circuit of claim 1, wherein the phase splitter is configured to generate the falling clock signal by inverting the phase of the DLL clock signal, and the rising clock and the falling clock have phases opposite to each other.

5. The duty cycle correction circuit of claim 1, wherein the clock delay unit includes:
  a first clock delay unit configured to delay the rising clock signal in response to the control signals to generate the delayed rising clock signal; and
  a second clock delay unit configured to delay the falling clock signal in response to the control signals to generate the delayed falling clock signal.

6. The duty cycle correction circuit of claim 5, wherein the first clock delay unit includes:
- a first delay unit configured to delay the rising clock signal by as much as a first time to generate a first delay signal;
- a second delay unit configured to delay the rising clock signal by as much as a second time, which is shorter than the first time, to generate a second delay signal; and
- a phase mixing unit configured to mix a phase of the first delay signal and a phase of the second delay signal in response to the control signals to generate the delayed rising clock signal.

7. The duty cycle correction circuit of claim 6, wherein the phase mixing unit includes:
- a first node;
- a first driving unit configured to drive the first delay signal in response to the control signals to transmit the first delay signal to the first node;
- a second driving unit configured to drive the second delay signal in response to the control signals to transmit the second delay signal to the first node; and
- a buffering unit configured to buffer signals transmitted to the first node to output the delayed rising clock signal.

8. The duty cycle correction circuit of claim 5, wherein the second clock delay unit includes:
- a first delay unit configured to delay the falling clock signal by as much as a first time to generate a first delay signal;
- a second delay unit configured to delay the falling clock signal by as much as a second time, which is shorter than the first time, to generate a second delay signal; and
- a phase mixing unit configured to mix a phase of the first delay signal and a phase of the second delay signal in response to the control signals to generate the delayed falling clock signal.

9. The duty cycle correction circuit of claim 8, wherein the phase mixing unit includes:
- a first node;
- a first driving unit configured to drive the first delay signal in response to the control signals to transmit the first delay signal to the first node;
- a second driving unit configured to drive the second delay signal in response to the control signals to transmit the second delay signal to the first node; and
- a buffering unit configured to buffer signals transmitted to the first node to output the delayed falling clock signal.

10. The duty cycle correction circuit of claim 1, wherein the duty ratio correction unit is configured to generate the correction rising clock signal and the correction falling clock signal that toggle to phases opposite to each other at every rising edge time of the delayed rising clock signal and the delayed falling clock signal.

11. The duty cycle correction circuit of claim 10, wherein the duty ratio correction unit includes:
- a rising pulse generation unit configured to generate a rising pulse signal that is produced in a pulse-type format at every rising edge of the delayed rising clock signal;
- a falling pulse generation unit configured to generate a falling pulse signal that is produced in a pulse-type format at every rising edge of the delayed falling clock signal;
- a rising clock generation unit configured to generate a rising driving clock signal that toggles in response to the rising pulse signal and the falling pulse signal;
- a falling clock generation unit configured to generate a falling driving clock signal that toggles in response to the rising pulse signal and the falling pulse signal;
- a rising latch unit configured to latch and drive the rising driving clock signal in response to a reset signal to generate the correction rising clock signal; and
- a falling latch unit configured to latch and drive the falling driving clock signal in response to the reset signal to generate the correction falling clock signal.

12. The duty cycle correction circuit of claim 1, wherein the delay control unit includes:
- a duty cycle detection unit configured to detect duty cycles of the correction rising clock signal and the correction falling clock signal to generate a detection signal; and
- a control signal generation unit configured to generate the control signals in response to the detection signal.

13. The duty cycle correction circuit of claim 12, wherein the control signal generation unit is configured to output digital signals having multiple bits as the control signals, in which the number of signals having a first logical value increases or decreases in response to the detection signal.

14. A semiconductor integrated circuit apparatus, comprising:
- a Delay Locked Loop circuit block configured to generate a DLL clock signal having a phase faster than a phase of an external clock signal by a predetermined time;
- a transmission line configured to transmit the DLL clock signal;
- a duty cycle correction circuit block configured to correct a duty cycle of the DLL clock signal transmitted through the transmission line to generate a correction rising clock signal and a correction falling clock signal; and
- a data output circuit block configured to perform a data output operation by using the correction rising clock signal and the correction falling clock signal,
wherein the duty cycle correction circuit block includes:
- a phase splitter configured to control the phase of the DLL clock signal to generate the rising clock signal and the falling clock signal;
- a clock delay unit configured to delay the rising clock signal and the falling clock signal in response to control signals to generate a delayed rising clock signal and a delayed falling clock signal;
- a duty ratio correction unit configured to generate the correction rising clock signal and the correction falling clock signal that toggle according to edge timings of the delayed rising clock signal and the delayed falling clock signal; and
- a delay control unit configured to detect duty cycles of the correction rising clock signal and the correction falling clock signal to generate the control signals, and
wherein the control signals are configured to be realized as digital signals having multiple bits.

15. The semiconductor integrated circuit apparatus of claim 14, wherein the DLL circuit block is configured to output the DLL clock signal as a single clock signal.

16. The semiconductor integrated circuit apparatus of claim 15, wherein the duty cycle correction circuit block is configured to control the phase of the DLL clock signal transmitted through the transmission line to generate the rising clock signal and the falling clock signal.

17. The semiconductor integrated circuit apparatus of claim 16, wherein the duty cycle correction circuit block is configured to perform a duty cycle correction operation on the rising clock signal and the falling clock signal to generate the correction rising clock signal and the correction falling clock signal.

18. The semiconductor integrated circuit apparatus of claim 14, wherein the clock delay unit is configured to delay the rising clock signal and the falling clock signal with variation according to logical values of the control signals in order that the delayed rising clock signal and the delayed falling clock signal have a phase difference by as much as one-half of a period.

19. The semiconductor integrated circuit apparatus of claim 18, wherein the clock delay unit includes:
   a first clock delay unit configured to delay the rising clock signal in response to the control signals to generate the delayed rising clock signal; and
   a second clock delay unit configured to delay the falling clock signal in response to the control signals to generate the delayed falling clock signal.

20. The semiconductor integrated circuit apparatus of claim 19, wherein the first clock delay unit includes:
   a first delay unit configured to delay the rising clock signal by as much as a first time to generate a first delay signal;
   a second delay unit configured to delay the rising clock signal by as much as a second time, which is shorter than the first time, to generate a second delay signal; and
   a phase mixing unit configured to mix a phase of the first delay signal and a phase of the second delay signal in response to the control signals to generate the delayed rising clock signal.

21. The semiconductor integrated circuit apparatus of claim 20, wherein the second clock delay unit includes:
   a first delay unit configured to delay the falling clock signal by as much as a first time to generate a first delay signal;
   a second delay unit configured to delay the falling clock by as much as a second time, which is shorter than the first time, to generate a second delay signal; and
   a phase mixing unit configured to mix a phase of the first delay signal and a phase of the second delay signal in response to the control signals to generate the delayed falling clock signal.

22. The semiconductor integrated circuit apparatus of claim 21, wherein the duty ratio correction unit is configured to generate the correction rising clock signal and the correction falling clock signal that toggle to phases opposite to each other at every rising edge time of the delayed rising clock signal and the delayed falling clock signal.

23. The semiconductor integrated circuit apparatus of claim 22, wherein the duty ratio correction unit includes:
   a rising pulse generation unit configured to generate a rising pulse signal that is produced in a pulse-type format at every rising edge of the delayed rising clock signal;
   a falling pulse generation unit configured to generate a falling pulse signal that is produced in a pulse-type format at every rising edge of the delayed falling clock signal;
   a rising clock generation unit configured to generate a rising driving clock signal that toggles in response to the rising pulse signal and the falling pulse signal;
   a falling clock generation unit configured to generate a falling driving clock signal that toggles in response to the rising pulse signal and the falling pulse signal;
   a rising latch unit configured to latch and drive the rising driving clock signal in response to a reset signal to generate the correction rising clock signal; and
   a falling latch unit configured to latch and drive the falling driving clock signal in response to the reset signal to generate the correction falling clock signal.

24. The semiconductor integrated circuit apparatus of claim 23, wherein the delay control unit is configured to detect duty cycles of the correction rising clock signal and the correction falling clock signal to generate a detection signal.

25. The semiconductor integrated circuit apparatus of claim 24, wherein the delay control unit is configured to output digital signals having multiple bits as the control signals in which the number of signals having a first logical value increases or decreases in response to the detection signal.

* * * * *